United States Patent
Van Den Broeke et al.

(10) Patent No.: US 7,614,034 B2
(45) Date of Patent: Nov. 3, 2009

(54) METHOD AND APPARATUS FOR GENERATING OPC RULES FOR PLACEMENT OF SCATTERING BAR FEATURES UTILIZING INTERFACE MAPPING TECHNOLOGY

(75) Inventors: Douglas Van Den Broeke, Sunnyvale, CA (US); Sangbong Park, Union City, CA (US); Chung-Wei Hsu, Taipei (TW); Jang Fung Chen, Cupertino, CA (US)

(73) Assignee: ASML Masktools B.V. (NL)

( * ) Notice: Subject to any disclaimer, the term of this patent is extended or adjusted under 35 U.S.C. 154(b) by 373 days.

(21) Appl. No.: 11/594,248

(22) Filed: Nov. 8, 2006

(65) Prior Publication Data
US 2007/0122719 A1   May 31, 2007

Related U.S. Application Data

(60) Provisional application No. 60/734,317, filed on Nov. 8, 2005.

(51) Int. Cl.
G06F 17/50 (2006.01)
G03F 1/00 (2006.01)
(52) U.S. Cl. .......................... 716/21; 430/5
(58) Field of Classification Search .......... 716/19–21; 430/5; 382/144
See application file for complete search history.

(56) References Cited

U.S. PATENT DOCUMENTS

| | | | |
|---|---|---|---|
| 2002/0157081 A1* | 10/2002 | Shi et al. | 716/19 |
| 2004/0209170 A1* | 10/2004 | Broeke et al. | 430/5 |
| 2005/0142449 A1* | 6/2005 | Shi et al. | 430/5 |
| 2005/0142470 A1* | 6/2005 | Socha et al. | 430/30 |
| 2005/0149900 A1* | 7/2005 | Laidig | 716/19 |
| 2007/0162889 A1* | 7/2007 | Broeke et al. | 716/21 |
| 2008/0014509 A1* | 1/2008 | Hsu et al. | 430/5 |

\* cited by examiner

*Primary Examiner*—Stacy A Whitmore
(74) *Attorney, Agent, or Firm*—Pillsbury Winthrop Shaw Pittman LLP (57) ABSTRACT

A method of applying optical proximity correction features to a mask having a plurality of features to be imaged. The method includes the steps of defining a set of process parameters to be utilized to image the mask; defining a set of pitch ranges corresponding to pitches exhibited by the plurality of features to be imaged; determining an interference map for at least one of the pitch ranges; and generating a set of rules for positioning scattering bars adjacent the plurality of features based on the interference map, where the set of rules governs scattering bar placement for features having a pitch which falls within the pitch range utilized to generate the interference map.

20 Claims, 7 Drawing Sheets

Interference Map Lithography (IML) concept

Binary Fresnel Lens

FIG. 1a

PSF

FIG. 1c

CPL Fresnel Lens

FIG. 8a    FIG. 8b 400-500nm spacing range

METHOD AND APPARATUS FOR GENERATING OPC RULES FOR PLACEMENT OF SCATTERING BAR FEATURES UTILIZING INTERFACE MAPPING TECHNOLOGY

CLAIM OF PRIORITY

This patent application, and any patent(s) issuing therefrom, claims priority from U.S. provisional patent application No. 60/734,317, filed on Nov. 8, 2005, entitled "Method Of Generating OPC Rules With Interference Mapping", which is incorporated herein by reference in its entirety.

FIELD OF THE INVENTION

The present invention relates to photolithography, and in particular relates to a method of generating a rule-base for applying optical proximity correction features to mask layouts utilizing an interference map. In addition, the present invention relates to a device manufacturing method using a lithographic apparatus comprising a radiation system for providing a projection beam of radiation; a mask table for holding a mask, serving to pattern the projection beam; a substrate table for holding a substrate; and a projection system for projecting the patterned projection beam onto a target portion of the substrate.

BACKGROUND OF THE INVENTION

Lithographic projection apparatus (tools) can be used, for example, in the manufacture of integrated circuits (ICs). In such a case, the mask contains a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic apparatus as here described can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing. Thereafter, the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

The lithographic tool may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic tools are described, for example, in U.S. Pat. No. 5,969,441 and WO 98/40791, incorporated herein by reference.

The photolithography masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way.

Of course, one of the goals in integrated circuit fabrication is to faithfully reproduce the original circuit design on the wafer (via the mask). Another goal is to use as much of the semiconductor wafer real estate as possible. As the size of an integrated circuit is reduced and its density increases, however, the CD (critical dimension) of its corresponding mask pattern approaches the resolution limit of the optical exposure tool. The resolution for an exposure tool is defined as the minimum feature that the exposure tool can repeatedly expose on the wafer. The resolution value of present exposure equipment often constrains the CD for many advanced IC circuit designs.

Furthermore, the constant improvements in microprocessor speed, memory packing density and low power consumption for micro-electronic components are directly related to the ability of lithography techniques to transfer and form patterns onto the various layers of a semiconductor device. The current state of the art requires patterning of CD's well below the available light source wavelengths.

One well known technique for improving the resolution performance of current imaging tools is the use of OPC techniques, which include the use of subresolution assist features, also known as scattering bars (SBs), within the mask design. For example, U.S. patent application Ser. Nos. 10/756,829 filed on Jan. 14, 2004; 10/756,830 filed on Jan. 14, 2004, and 10/878,490 filed Jun. 29, 2004, all of which are assigned to the assignee of the instant application, and all of which are incorporated herein by reference in their entirety, disclose a concept of placing SBs and non-printable phase features in the mask design utilizing interference maps (IM). While the concept has been demonstrated feasible for manufacturing purposes, it can still be a challenging process to apply the concepts into a manufacturing worthy implementation, especially when dealing with complex mask designs.

For example, current techniques for applying scattering bars to a mask design can be a time consuming process due to the complexities of today's current masks. This problem can be exacerbated when the scattering bars are placed in the mask design utilizing interference mapping techniques identified above. Accordingly, there is a need for a method of applying scattering bars to a mask design utilizing the interference mapping technology, which simplifies the application of the scattering bars to the mask design, and which allows for a robust application of scattering bars to the design without requiring a significant amount of calculations to be performed by the CAD system, so as to minimize the amount of time required to complete the design process.

SUMMARY OF THE INVENTION

In an effort to solve the foregoing needs, it an object of the present invention to provide a rule-based approach for applying scattering bars to a mask design, which utilizes the interference map in the rule formation process, so as to take advantage of and incorporate the improved performance regarding SB placement associated with the interference mapping technique.

More specifically, the present invention relates to a method of applying optical proximity correction features to a mask having a plurality of features to be imaged. The method includes the steps of defining a set of process parameters to be utilized to image the mask; defining a set of pitch ranges corresponding to pitches exhibited by the plurality of features to be imaged; determining an interference map for at least one of the pitch ranges; and generating a set of rules for positioning scattering bars adjacent the plurality of features based on the interference map, where the set of rules governs scattering bar placement for features having a pitch which falls within the pitch range utilized to generate the interference map.

In addition, the present invention relates to a computer program product for controlling a computer comprising a recording medium readable by the computer, means recorded on the recording medium for directing the computer to generate files corresponding to a mask having a plurality of features to be imaged in an lithographic imaging process. The generation of the files includes the steps of defining a set of process parameters to be utilized to image the mask; defining a set of pitch ranges corresponding to pitches exhibited by the plurality of features to be imaged; determining an interference map for at least one of the pitch ranges; and generating a set of rules for positioning scattering bars adjacent the plurality of features based on the interference map, where the set of rules governs scattering bar placement for features having a pitch which falls within the pitch range utilized to generate the interference map.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term mask as employed in this text may be broadly interpreted as referring to generic patterning means that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning means include:

a) A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference. b) A programmable LCD array. An example of such a construction is given in U.S. Pat. No. 5,229,872, which is incorporated herein by reference.

The method of the present invention provides important advantages over the prior art. Most importantly, the rule-based approach of the present invention for applying scattering bars to a mask design, which utilizes the interference map in the rule formation process, simplifies the process of applying the scattering bars to the mask design, and allows for a robust application of scattering bars to the design without requiring a significant amount of calculations to be performed by the CAD system, thereby minimizing the amount of time required to complete the design process. Further, the method also allows for rapid determination of the locations to apply scattering bars in areas not necessarily identified by the interference map to require scattering bars.

Additional advantages of the present invention will become apparent to those skilled in the art from the following detailed description of exemplary embodiments of the present invention.

The invention itself, together with further objects and advantages, can be better understood by reference to the following detailed description and the accompanying drawings.

DETAILED DESCRIPTION OF THE INVENTION

As explained in more detail below, the rule-based approach of the present invention for applying scattering bars to a mask design, which utilizes the interference map in the rule formation process, simplifies the process of applying the scattering bars to the mask design, and allows for a robust application of scattering bars to the design without requiring a significant amount of calculations to be performed by the CAD system, thereby minimizing the amount of time required to complete the design process. Further, the method also allows for rapid determination of the locations to apply scattering bars in areas not necessarily identified by the interference map to require scattering bars.

Figure 1A:
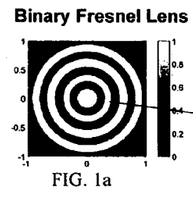
FIGS. 1a-1d illustrate an example of the generation of an interference map for an isolated contact.
Figure 1B:
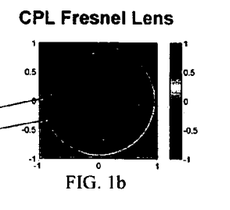
Figure 1C:
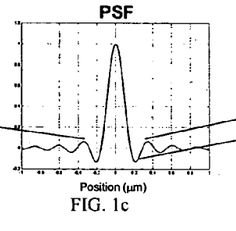
Figure 1D:
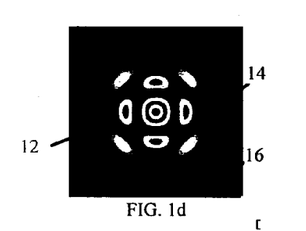

FIGS. 1a-1d illustrates an example of the generation of an interference map for an isolated contact illuminated using Quasar™ illumination, which can be generated using either an empirical method or a simulation method as detailed in U.S. patent application Ser. Nos. 10/756,829 filed on Jan. 14, 2004; 10/756,830 filed on Jan. 14, 2004, and 10/878,490 filed Jun. 29, 2004, all of which are incorporated herein by reference in their entirety. FIGS. 1a and 1b illustrate an exemplary binary fresnel lens and CPL fresnel lens, respectively, which correspond to utilizing a binary mask and a chromeless-phase-lithography (CPL) mask, respectively. FIG. 1c illustrates the image intensity utilizing a point spread function (PSF) associated with the isolated contact. In the case of an isolated contact, the interference map is directly proportional to the PSF. FIG. 1d illustrates an exemplary interference map associated with the isolated contact.

As is known, it is possible to identify areas of constructive and destructive interference with respect to the imaging of the given feature with an interference map. Once these areas are identified, scattering bars having the proper phase assigned relative to the main feature, can be placed in the mask design to constructively enhance the printing of the main feature. Referring to FIG. 1d, the yellow and red regions 12 in the interference map represent areas where the zero phase light has the strongest positive affect on the contact imaging. The blue regions 14 represent areas where π-phase shifted light has the strongest positive affect on the contact imaging, and the black regions 16 represent areas where neither π-phase shifted light nor zero phase light have a positive affect on contact imaging.

When utilizing a binary mask, the positive areas of the PSF are assigned a transmission of 1, and negative areas are assigned a transmission value of 0, which defines whether or not a given area is permitted to transmit light. When utilizing a CPL mask, the positive areas of the PSF are assigned a transmission of +1 (i.e., non-phase-shifted) and the negative areas are assigned a transmission of −1 (i.e., phase-shifted). CPL masks differ from binary masks in that in addition to non-phase-shifted transmissive areas and non-transmissive areas being included in the mask, the CPL mask also provides for phase-shifted, transmissive areas within the mask.

Figure 2:
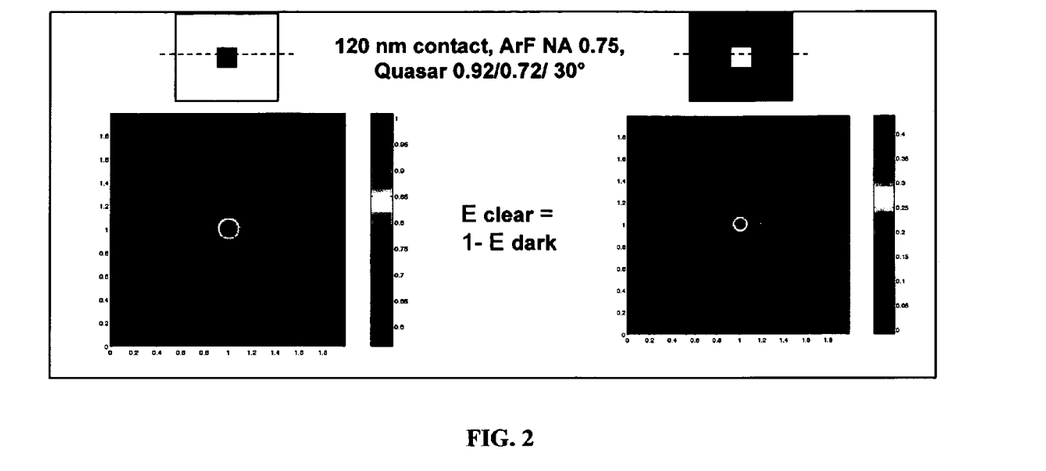
FIG. 2 illustrates the respective E-field amplitude distribution for both a clear field and dark field mask for the isolated contact feature.
Figure 3:
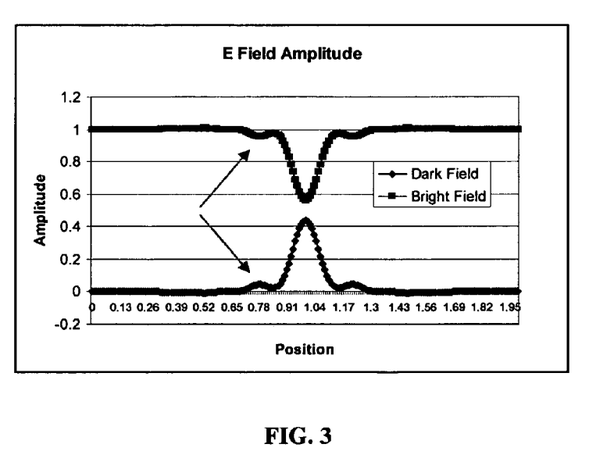
FIG. 3 illustrates a plot of the E-field amplitudes of the clear-field and dark-field masks for the isolated contact feature.

FIGS. 2 and 3 illustrate that the interference map for a given process and feature is essentially the same for a clear-field and dark-field masks, with the exception that that amplitude maximum and minimum are opposite one another. Specially, FIG. 2 illustrates the respective E-field amplitude distribution for both a clear field and dark field mask for the isolated contact feature. As shown, the amplitudes are essentially opposite one another. FIG. 3 illustrates a plot of the E-field amplitudes of the clear-field and dark-field masks for the isolated contact feature. Once again, the plots are essentially opposite one another. It is noted that the present invention can be utilized with either a clear-field mask or a dark-field mask.

In accordance with the method of the present invention, as described in more detail below, once the interference map is generated, the minima and maximum locations identified by the interference map are utilized in conjunction with a SB placement rule to define the location of the SB relative to the feature to be imaged. In the preferred embodiment, the interference map is determined for various pitches, each of which covers a predetermine pitch range, and then the minima and maximum locations of the given interference map is utilized to determine the locations of the SB relative to the features to be imaged located within the given pitch range. Further, interpolation techniques can be also utilized to determine the location of the SBs within a given range as illustrated below. Thus, the present invention utilizes the interference map to generate a rule base for defining placement of the scattering bars within the mask, where distinct rules are defined for each of the predefined pitch regions. An example of the method of the present invention will now be presented.

Figure 4:
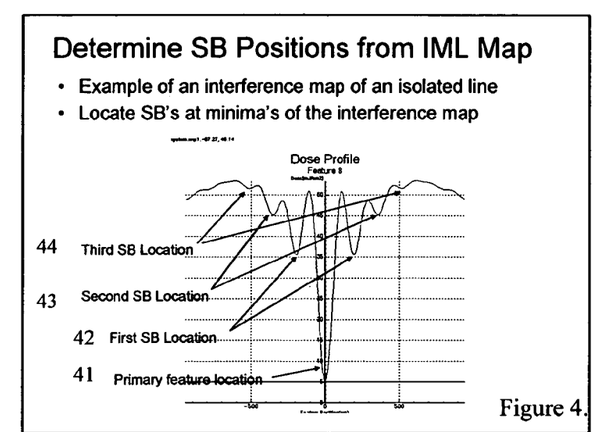
FIG. 4 illustrates an interference map corresponding to an isolated line feature (clear-field).

FIG. 4 illustrates an interference map corresponding to an isolated line feature (clear-field) for a given process. As shown, the interference map indicates numerous positive and negative peaks, which correspond to the maximum's and minima's of the interference map. These maximum's and minima's are utilized to define the location of the SBs within the mask design.

More specifically, the minima locations adjacent the primary feature are identified from the interference map and then scattering bars are placed at the minima locations. As is the case in FIG. 4, typically, corresponding minima's are located on both sides of the primary feature. Referring to the example shown in FIG. 4, there are three minima locations, and therefore three locations at which scattering bars would be placed within the mask design. These locations are identified as the First SB location 42, the Second SB Location 43 and the Third SB Location 44 in FIG. 4. As shown, at each location the minima occurs at a corresponding position on the opposite side of the Primary Feature Location 41, and therefore a pair of scattering bars would be positioned (one of each side of the primary feature) at the first, second and third locations.

In accordance with the given embodiment, minima locations are defined as locations within the interference map in which the resulting dose at the given location is a predefined percentage below the maximum dose of the interference map. This predefined difference is process and design dependent, and can be determined and set by the designer as a preliminary step in the process. As a general rule, minima's can be defined as locations which have a dosage/intensity which is 10% lower (for clear field masks) than the maximum dosage.

It is noted that outside a certain range, which is also process and design dependent, the value of the interference map reaches a maximum value and remains approximately equal to the maximum, with minor variations from the maximum being caused, for example, by noise. As such, for isolated features, it is also possible to disregard the interference map at locations outside of the maximum value (i.e., only consider placing scattering bars in areas at minima's which are located a distance from the primary feature which is less than the distance from the primary feature to the maxima). In the example shown in FIG. 4, the maximum occurs at a location 500 nm from the center of the primary feature. As such, minima's would only be considered if located less than 500 nm from the primary feature. It is further noted that in the event a dark-field mask is utilized, the criteria for determining the location of the scattering bars based on the interference map would be the opposite from that described above. For example, as opposed to defining the locations of the scattering bars as locations which are 10% less than the maxima, they would be defined as 10% greater than the minimum value of the dose/intensity of the corresponding interference map.

Once the scattering bar locations are determined for the interference map corresponding to the given pitch, scattering bar rules are defined for each of the scattering bar sets identified by the process set forth above. Specifically, utilizing the following equation:

$$SB \text{ rule} = (IML \text{ minima pitch}/2 - \text{linewidth}/2 - SB \text{ width}/2) \quad (1)$$

where the IML minima pitch is equal to the pitch separating a set of scattering bars, the line width corresponds to the line width of the feature being imaged, and the SB width is the width of the scattering bar, which is typically a predefined, set value, the locations of the various sets of scattering bars for the given pitch are defined. These rules are then applied to each feature in the design falling within the given pitch range.

Figure 5:
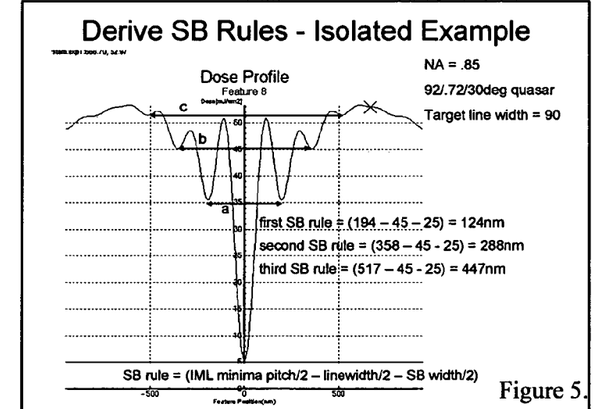
FIG. 5 illustrates an example of the application of the scattering bar placement rule of the present invention with respect to an exemplary interference map.

Referring to FIG. 5, which illustrates an example of how the foregoing equation is applied, the pitch "a" between the first set of scattering bars is 388 nm, the line width of the target pattern is 90 nm, and the SB width is 50 nm. Applying Equation 1 to the foregoing numbers results in the edge of each of the first scattering bars being placed 124 nm from the opposing edge of the primary feature. Continuing, the pitch "b" between the second set of scattering bars is 716 nm, and therefore applying Equation 1, the edge of each of the second scattering bars is placed 288 nm from the opposing edge of the primary feature. Finally, the pitch "c" between the third set of scattering bars is 1034 nm, and therefore applying Equation 1, the edge of each of the third scattering bars is placed 477 nm from the opposing edge of the primary feature. Once determined, these numbers defining the distance of the scattering bars from the primary feature can be utilized to place scattering bars adjacent any feature falling within the pitch range which would qualify the feature as an isolated feature. As explained in further detail below, the designer initially defines a set of pitch ranges representing dense to isolated features, and an interference map is generated for each individual pitch range, and then the scattering bar placement rules are determined for each pitch range. The number of pitch ranges required is design and process dependent. Further, in the preferred embodiment, the interference map associated with a given pitch range is generated utilizing a pitch which is substantially in the middle of the given pitch range. In a typical example, a new pitch range may be defined every 100 nm.

Figure 6:
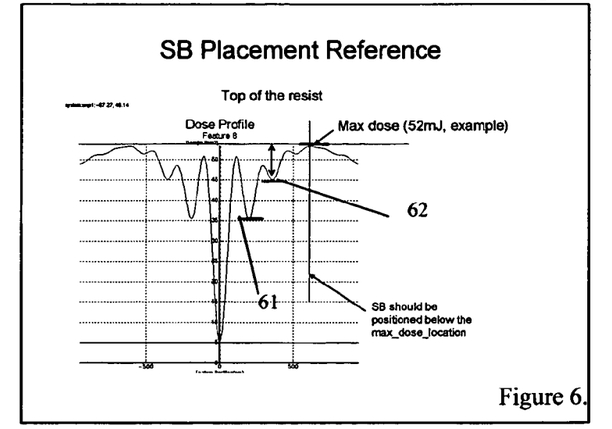
FIG. 6 illustrates another example of the application of the scattering bar placement rule with respect to an exemplary interference map.

FIG. 6 illustrates another example of the identification of minima's in the interference map, which are utilized to determine the number of scattering bars placed adjacent the feature, and subsequently the rule set for defining the location of the scattering bars relative to the primary feature for the given pitch range. Referring to FIG. 6, and applying the foregoing rule, it is determined from the interference map that the maximum dose is 52 mj. As such, any valid minima must exhibit a dose which is at least 10% less than 52 mj, or in other words, have a dose which is no greater than 46.2 mj. As shown, this occurs in two locations 61 and 62, where 61 defines the location of the first set of scattering bars and 62 defines the location of the second set of scattering bars. Thus, in this example, only two sets of scattering bars are generated. Similar to the previous example, the placement rules associated with these two sets of scattering bars can be calculated utilizing Equation (1), and then applied to other features falling within the given pitch range.

Figure 7:
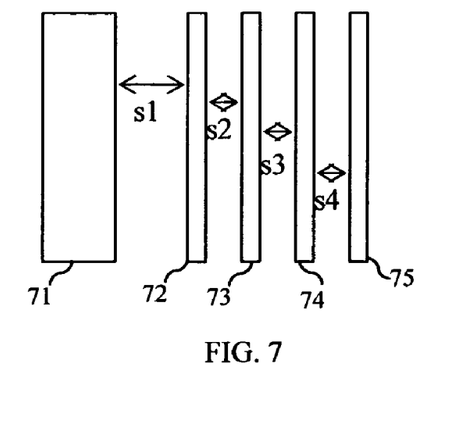
FIG. 7 illustrates an example of the placement of scattering bars adjacent a primary feature in accordance with the present invention.

It is noted that in areas of the mask design where space between features permits, it is also possible to place additional scattering bars adjacent the primary feature beyond those indicated by the interference map. Such a situation would typically occur when dealing with isolated features. For example, utilizing the Example of FIG. 6, this interference map illustrates two sets of scattering bars being placed adjacent the feature. Referring now to FIG. 7, these two sets of scattering bars would be elements 72 and 73, where the primary feature is element 71. The distance, S1, between the primary feature and the first scattering bar 72, and the distance, S2, between the first scattering bar 72 and the second scattering bar 73 can be determined utilizing the interference map and Equation (1) above. If it is desirable to add two additional scattering bars (elements 74 and 75), they can simply be spaced at distances S3 and S4, respectively, where S3 and S4 are also equal to S2.

Figures 8A, 8B:
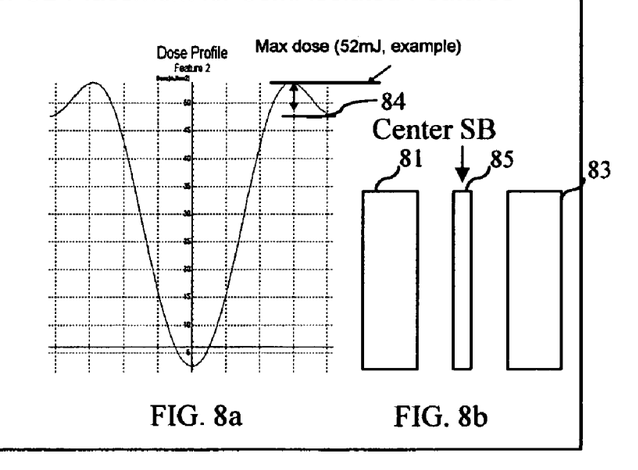
FIGS. 8a and 8b illustrate an example of placing scattering bars adjacent a semi-isolated feature utilizing the method of the present invention.

FIGS. 8a and 8b illustrate an example of placing scattering bars adjacent a semi-isolated feature utilizing the foregoing method. As noted above, the first step in the process is to generate an interference map for the features having the desired pitch, the result of which is shown in FIG. 8a. Then, the next step in the process is to determine the minima's identified in the interference map to determine the location of the scattering bars relative to the primary feature. In the given example, the minima is defined as a location having a dosage which is 10% less than the maximum dosage of the interference map. Referring to FIG. 8a, it is shown that there is a single minima indicated by the interference map at location 84, which would be the location at which the scattering bar is placed, the precise location of which can be determined by Equation (1). It is noted that if the interference map indicates that only a single scattering bar 85 is placed between two adjacent primary features 81 and 83, and the interference map does not indicate the scattering bar 85 should be centered between the two features 81 and 83, it is acceptable to center the scattering bar between the two features as shown in FIG. 8b.

As the pitch between the features is reduced, at a certain point for each given process, there is no longer sufficient room to place scattering bars between the features, and in such situations the interference map would not indicate any locations satisfying the minima criteria. However, as shown in examples set forth below, it is also possible, that for a given process in pitch ranges that the designer knows require scattering bars, that the interference map fails to identify locations that satisfy the minima criteria utilized for placement of scattering bars. In such situations, additional processing must be performed to determine the scattering bar locations. In a first approach, the interference map is regenerated for the given pitch utilizing a different defocus value, which will function to increase the amplitude of the minima's and therefore identify locations for placement of the scattering bars. A general rule, the defocus should be changed by λ/NA, where λ is the wavelength of the exposure tool, and NA is the numerical aperture of the exposure tool. Of course, it is also acceptable to change the defocus by different amounts. It is noted that the change in defocus will not cause a scattering bar location to be identified in densely spaced areas which do not require scattering bars.

An alternative approach for solving the foregoing issue is to determine the scattering bar requirements for pitch ranges adjacent to the pitch range having no minima's identified by the interference map, and then interpolate the known scattering bar requirements of the adjacent pitch ranges to determine the scattering bar requirements for the pitch range in question. Examples of both of the foregoing approaches are set forth below.

Table 1 sets forth exemplary results of applying the method of the present invention to a given process. As shown, the pitch ranges have been classified into seven ranges, each of which except for the highest and the lowest, span 100 nm. As described above, an interference map is generated for each of the pitch ranges, and preferably a pitch in the center of the range would be utilized when generating the interference map associated with the given range (e.g., a pitch of 450 nm is utilized when generating the interference map for the 400-500 nm range). For the highest and lowest ranges, it is preferably to utilize lowest and highest pitch value, respectively, in the given range (i.e., for the range 700 nm or greater range, compute the interference map at 700 nm, and for the range 200 nm or less, compute the interference map at 200 nm) when generating the interference map.

Referring to Table I, it is shown that for the pitch range 200 nm or below, no scattering bars are required. For pitch ranges 200-300 nm and 400-500 nm, a center scattering bar (CSB) is required, and for the pitch ranges from 500-600 nm and above, multiple scattering bars are necessary. However, utilizing the initial interference map (which utilizes zero defocus), there is no scattering bar requirement identified for the 300-400 nm pitch range.

TABLE I

| Spacing (nm) | SB type identified |
| --- | --- |
| 700 nm or higher | multiple SB |
| 600-700 nm | multiple SB |
| 500-600 nm | multiple SB |
| 400-500 nm | CSB |
| 300-400 nm | (no CSB identified)← |
| 200-300 nm | CSB |
| Below 200 nm | no need for any SB placement |

Accordingly, as indicated above, the scattering bar requirements for the 300-400 nm range can be determined by generating another interference map for the pitch range utilizing a defocus setting. The interference map utilizing defocus will enhance the minima's and likely result in a minima location that satisfies the criteria for placing a scattering bar. Alternatively, the location of the scattering bar for the 300-400 nm range can be determined by averaging the locations of the CSB identified in the 200-300 nm range and the 400-500 nm pitch range, and utilizing the resulting average location. Of course, in this situation where there are CSBs on both sides of the unknown pitch range, the CSB would simply be placed in the middle between the two primary features in the unknown pitch range.

Table II illustrates an example in which the pitch region for which the location of the scattering bars cannot be determined from the initial interference map is the 600-700 nm pitch range. Similar to the foregoing example, the scattering bar location for the 600-700 nm range can be determined by generating another interference map for the pitch range utilizing a defocus setting. Alternatively, the location of the scattering bar for the 600-700 nm range can be determined by averaging the locations of the multiple scattering bars identified in the 500-600 nm range and the 700 nm or greater pitch range, and utilizing the resulting average locations. For example, if the first and second set of scattering bars were placed a distance of 200 nm and 250 nm, respectively, from the first primary feature in the 500-600 nm pitch range, and the first and second set of scattering bars were placed a distance of 300 nm and 350 nm, respectively, from the first primary feature in the 700 nm pitch range, by averaging the values, the first and second set of scattering bars are placed a distance of 250 nm and 300 nm from the first primary feature in the 600-700 nm pitch range.

TABLE II

| Spacing (nm) | SB type identified |
| --- | --- |
| 700 nm or higher | multiple SB |
| 600-700 nm | (no SB identified)← |
| 500-600 nm | multiple SB |
| 400-500 nm | CSB |
| 300-400 nm | CSB |
| 200-300 nm | CSB |
| Below 200 nm | no need for any SB placement |

Table III sets forth yet another example, in which the pitch region for which the location of the scattering bars cannot be determined from the initial interference map is the 400-500 nm pitch range. This example is distinct from the foregoing examples because the adjacent pitch regions require different solutions (i.e., CSB and multiple SBs). In such a situation, the scattering bar location for the 400-500 nm pitch range can still be determined by generating another interference map for the pitch range utilizing a defocus setting. However, if the averaging technique is to be utilized, a slight modification to the process disclosed above is necessary.

TABLE III

| Spacing (nm) | SB type identified |
| --- | --- |
| 700 nm or higher | multiple SB |
| 600-700 nm | multiple SB |
| 500-600 nm | multiple SB |
| 400-500 nm | (no SB identified)← |
| 300-400 nm | CSB |
| 200-300 nm | CSB |
| Below 200 nm | no need for any SB placement |

Figure 9:
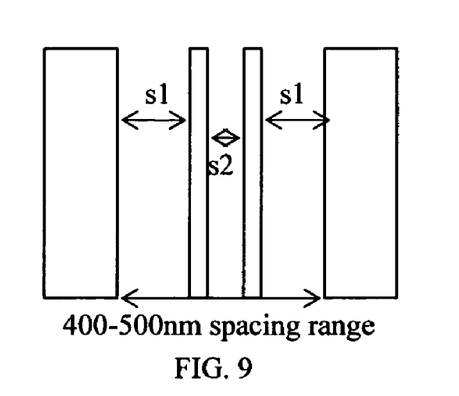
FIG. 9 illustrates an example of placing multiple scattering bars between adjacent features in accordance with the method of the present invention.

More specifically, in such situations, if possible, it is preferable to utilize two scattering bars between the adjacent primary features. As such, the first step is to place the first scattering bar at a distance S1 away from the main feature, where S1 corresponds to the same distance the first scattering bar is placed from the main feature in the 500-600 nm pitch range. Then, the minimum spaced allowed for placement of a scattering bar is determined for the given process, which is defined by:

$$S2 > 0/4(\lambda/NA) \qquad (2)$$

where λ is the wavelength of the exposure tool and NA is the numerical aperture of the exposure tool. Using the result of this equation, it is possible to determine if it is possible to place a second scattering bar with the 400-500 nm pitch range. An illustration of the use of the multiple scattering bars is shown in FIG. 9. It is noted that if the second scattering bar can be utilized, the second scattering bar is also placed a distance, S1, away from the second primary feature. Of course, if the pitch range cannot accommodate a second scattering bar, a single CSB is utilized and it is positioned in between the first and second primary feature.

Figure 10:
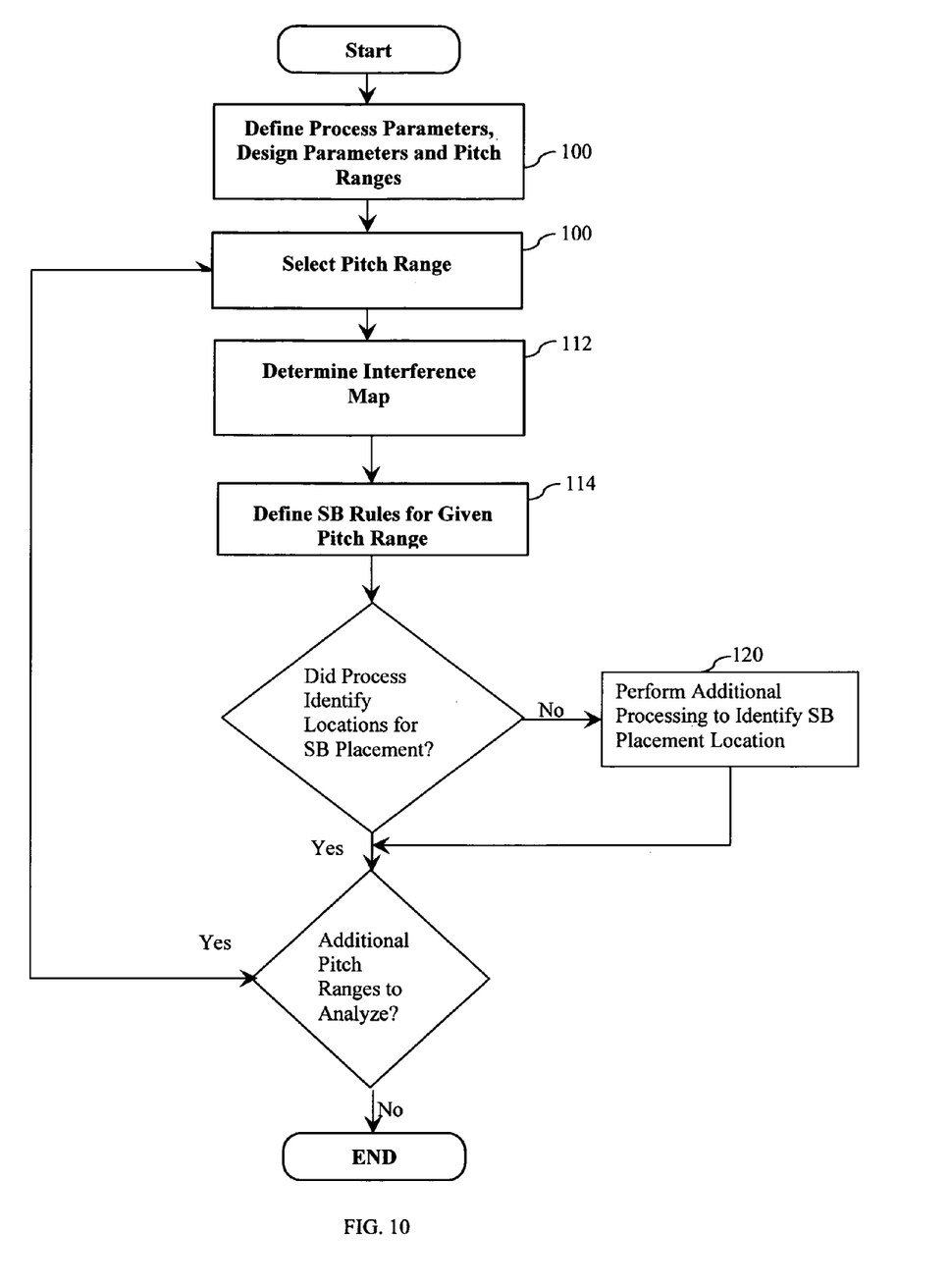
FIG. 10 sets forth an exemplary flowchart illustrating the process of the present invention.

FIG. 10 sets forth an exemplary flowchart illustrating the process of the present invention described above. Referring to FIG. 10, the first step (Step 100) is to define the process parameters and design parameters to be utilized in the given process. This step also includes defining the pitch ranges to be utilized. Of course, the selection of the pitch ranges is design and process dependent, and can be determined by the designer/operator in accordance with the design requirements. The next step (Step 110) is to select the first pitch range. Typically, the method proceeds from smallest to largest pitch range, however, it is also possible to reverse the order. Once the pitch range is selected, an interference map utilizing the predefined process parameters is generated for the given pitch range (Step 112). Once the interference map is generated, the scattering bar rules are determined for the given pitch range utilizing the method and equations detailed above (Step 114). It is then determined whether or not the process identified locations for placement of scattering bars for the given pitch range (Step 116). If the answer is YES, the process proceeds to determine if there are any remaining pitch ranges to consider (Step 118), and if so, proceeds back to Step 110 and repeats the foregoing process for the next pitch range. However, if the answer at Step 116 is NO, the process proceeds to Step 120 to perform additional processing as detailed above to determine where to place the scattering bars within the given pitch range, or confirm that the given pitch range does not require scattering bars. Once all of the pitch ranges are processed, the process is complete. It is noted that the results of the placement of the scattering bars for the given pitch ranges are stored in memory and thereafter utilized in the mask design process to apply scattering bars in accordance with the stored results as necessary to the features contained in the actual target pattern. It is further noted that the foregoing process can be implemented in a CAD system for applying OPC techniques to target mask pattern, and performed automatically by the CAD system once the initial process parameters and design requirements are input by the designer/operator.

The method of the present invention is a fast, efficient and reliable method for establishing a set of OPC rules, with respect to scattering bar placement, for dense to isolated features. Indeed, once the scattering bar placement rules are defined for each pitch range, the scattering bars can be readily applied to the overall mask design. It is noted that a printability check can be utilized to confirm that the placement of the scattering bars with the target design satisfies the design requirements, and if for some reason they do not, standard OPC modification techniques, such as shrinking the scattering bar width, can be implemented in an effort to satisfy the design constraints.

As noted above, the method of the present invention provides important advantages over the prior art. Most importantly, the rule-based approach of the present invention for applying scattering bars to a mask design, which utilizes the interference map in the rule formation process, simplifies the process of applying the scattering bars to the mask design, and allows for a robust application of scattering bars to the design without requiring a significant amount of calculations to be performed by the CAD system, thereby minimizing the amount of time required to complete the design process. Further, the method also allows for rapid determination of the locations to apply scattering bars in areas not necessarily identified by the interference map to require scattering bars.

Figure 11:
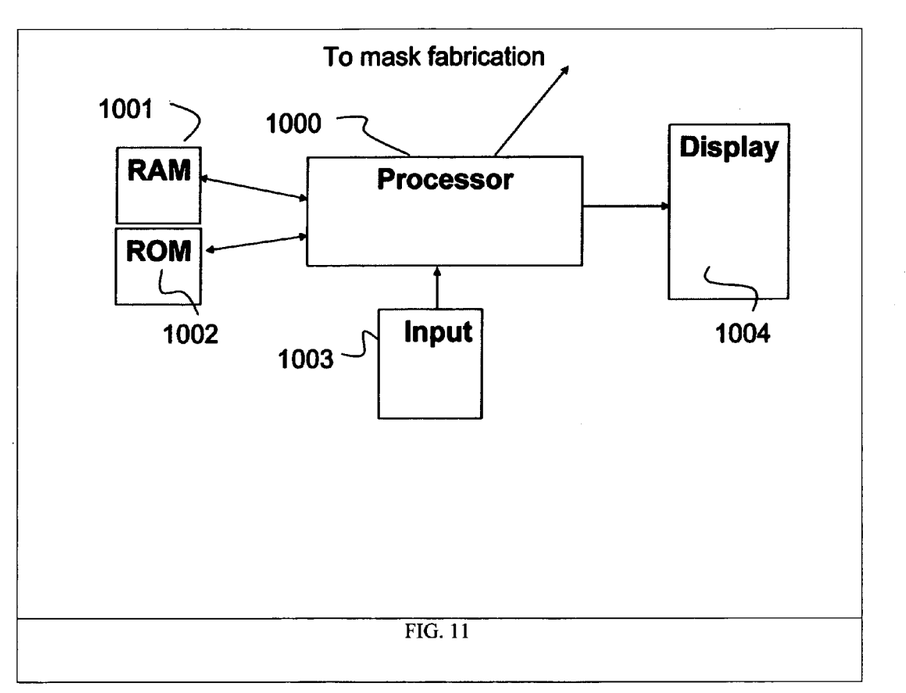
FIG. 11 illustrates an exemplary processing system for implementing the OPC method of the present invention.

FIG. 11 illustrates an exemplary processing system for implementing the mask design method of the present invention. As illustrated in FIG. 11, an exemplary processing system may contain a processor 1000 which receives input from an input 1003. Processor 1000 may be a conventional microprocessor or may be a specially designed processing unit, such as an EEPROM or EPROM or a fabricated integrated circuit. Input 1003 may be any type of electronic input device, such as a keyboard or a mouse, or may be a memory or internet connection. Processor 1000 preferably retrieves stored protocols from ROM 1002 and RAM 1001, such as protocols to implement the methods detailed above for generating a mask layout in accordance with the present invention, and stores information on RAM 1001. The calculated results (e.g., mask design) of processor 1000 may be displayed on display 1004 and may be provided to a mask fabrication unit.

The software functionalities of such a computer system involve programming, including executable code, may be used to implement the above described OPC method for placing scattering bars within a given target pattern. The software code is executable by the general-purpose computer. In operation, the code and possibly the associated data records are stored within a general-purpose computer platform. At other times, however, the software may be stored at other locations and/or transported for loading into the appropriate general-purpose computer systems. Hence, the embodiments discussed above involve one or more software products in the form of one or more modules of code carried by at least one machine-readable medium. Execution of such code by a processor of the computer system enables the platform to implement the catalog and/or software downloading functions, in essentially the manner performed in the embodiments discussed and illustrated herein.

As used herein, terms such as computer or machine "readable medium" refer to any medium that participates in providing instructions to a processor for execution. Such a medium may take many forms, including but not limited to, non-volatile media, volatile media, and transmission media. Non-volatile media include, for example, optical or magnetic disks, such as any of the storage devices in any computer(s) operating as one of the server platform, discussed above. Volatile media include dynamic memory, such as main memory of such a computer platform. Physical transmission media include coaxial cables; copper wire and fiber optics, including the wires that comprise a bus within a computer system. Carrier-wave transmission media can take the form of electric or electromagnetic signals, or acoustic or light waves such as those generated during radio frequency (RF) and infrared (IR) data communications. Common forms of computer-readable media therefore include, for example: a floppy disk, a flexible disk, hard disk, magnetic tape, any other magnetic medium, a CD-ROM, DVD, any other optical medium, less commonly used media such as punch cards, paper tape, any other physical medium with patterns of holes, a RAM, a PROM, and EPROM, a FLASH-EPROM, any other memory chip or cartridge, a carrier wave transporting data or instructions, cables or links transporting such a carrier wave, or any other medium from which a computer can read programming code and/or data. Many of these forms of computer readable media may be involved in carrying one or more sequences of one or more instructions to a processor for execution.

Figure 12:
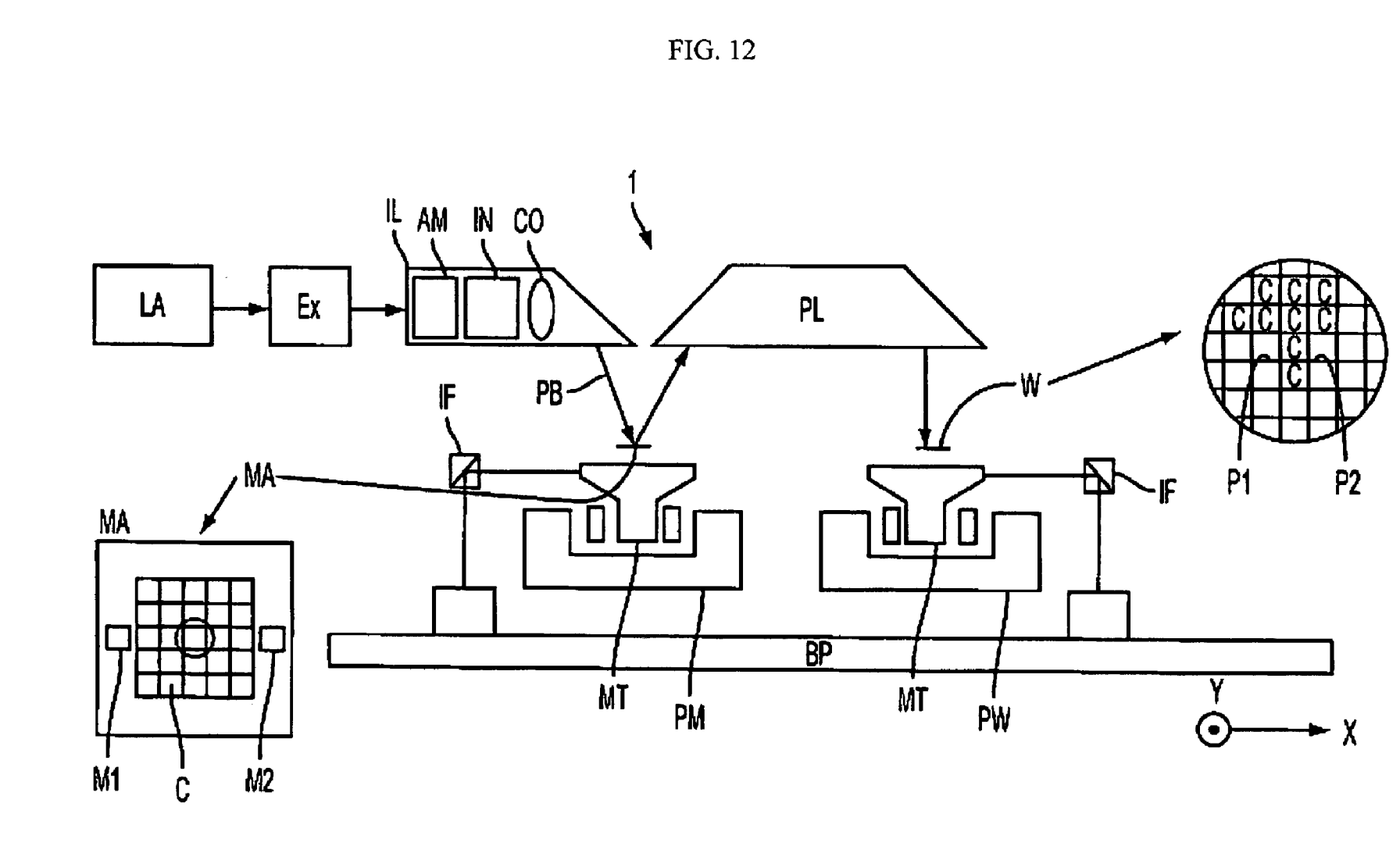
FIG. 12 schematically depicts a lithographic projection apparatus suitable for use with the masks designed with the aid of the current invention.

FIG. 12 schematically depicts a lithographic projection apparatus suitable for use with the masks designed with the aid of the current invention. The apparatus comprises:
- a radiation system Ex, IL, for supplying a projection beam PB of radiation. In this particular case, the radiation system also comprises a radiation source LA;
- a first object table (mask table) MT provided with a mask holder for holding a mask MA (e.g. a reticle), and connected to first positioning means for accurately positioning the mask with respect to item PL;
- a second object table (substrate table) WT provided with a substrate holder for holding a substrate W (e.g. a resist-coated silicon wafer), and connected to second positioning means for accurately positioning the substrate with respect to item PL;
- a projection system ("lens") PL (e.g. a refractive, catoptric or catadioptric optical system) for imaging an irradiated portion of the mask MA onto a target portion C (e.g. comprising one or more dies) of the substrate W.

As depicted herein, the apparatus is of a transmissive type (i.e. has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g. a mercury lamp, excimer laser or plasma discharge source) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 12 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g. with the aid of suitable directing mirrors); this latter scenario is often the case when the source LA is an excimer laser (e.g. based on KrF, ArF or $F_2$ lasing). The current invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 12. However, in the case of a wafer stepper (as opposed to a step-and-scan tool) the mask table MT may just be connected to a short stroke actuator, or may be fixed.

The depicted tool can be used in two different modes:
- In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;
- In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

In addition, the concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of a ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

It is also noted that while the concepts disclosed herein may be used for imaging on a substrate such as a silicon wafer, it shall be understood that the disclosed concepts may be used with any type of lithographic imaging systems, e.g., those used for imaging on substrates other than silicon wafers.

Although certain specific embodiments of the present invention have been disclosed, it is noted that the present invention may be embodied in other forms without departing from the spirit or essential characteristics thereof. The present embodiments are therefore to be considered in all respects as illustrative and not restrictive, the scope of the invention being indicated by the appended claims, and all changes that come within the meaning and range of equivalency of the claims are therefore intended to be embraced therein.

We claim:

1. A computer implemented method of applying optical proximity correction features to a mask having a plurality of features to be imaged, said method comprising the steps of:
    defining a set of process parameters to be utilized to image said mask;
    defining a set of pitch ranges corresponding to pitches exhibited by said plurality of features to be imaged;

determining an interference map for at least one of said pitch ranges; and said computer generating a set of rules for positioning scattering bars adjacent said plurality of features based on said interference map, said set of rules governing scattering bar placement adjacent features of said plurality of features having a pitch which falls within said at least one of said pitch ranges.

2. The method of claim 1, further comprising the step of positioning scattering bars within said mask in accordance with said set of rules.

3. The method of claim 1, further comprising the steps of:
determining an interference map for each of said set of pitch ranges; and generating a set of rules for positioning scattering bars adjacent said plurality of features based on said interference map for each pitch range in said set of pitch ranges, each of said set of rules governing scattering bar placement for a specific pitch range.

4. The method of claim 3, further comprising the step of modifying the set of rules associated with a given pitch range based on the set of rules associated with an adjacent pitch range.

5. A computer implemented method of generating a mask having a plurality of features to be imaged and optical proximity correction features disposed therein, said computer implemented method comprising the steps of:
defining a set of process parameters to be utilized to image said mask;

defining a set of pitch ranges corresponding to pitches exhibited by said plurality of features to be imaged;

determining an interference map for at least one of said pitch ranges; and said computer generating a set of rules for positioning scattering bars adjacent said plurality of features based on said interference map, said set of rules governing scattering bar placement adjacent features of said plurality of features having a pitch which falls within said at least one of said pitch ranges.

6. The method of claim 5, further comprising the step of positioning scattering bars within said mask in accordance with said set of rules.

7. The method of claim 5, further comprising the steps of:
determining an interference map for each of said set of pitch ranges; and generating a set of rules for positioning scattering bars adjacent said plurality of features based on said interference map for each pitch range in said set of pitch ranges, each of said set of rules governing scattering bar placement for a specific pitch range.

8. The method of claim 7, further comprising the step of modifying the set of rules associated with a given pitch range based on the set of rules associated with an adjacent pitch range.

9. An apparatus for generating a mask having a plurality of features to be imaged and optical proximity correction features disposed therein, said apparatus comprising:
means for defining a set of process parameters to be utilized to image said mask;

means for defining a set of pitch ranges corresponding to pitches exhibited by said plurality of features to be imaged;

means for determining an interference map for at least one of said pitch ranges; and means for generating a set of rules for positioning scattering bars adjacent said plurality of features based on said interference map, said set of rules governing scattering bar placement adjacent features of said plurality of features having a pitch which falls within said at least one of said pitch ranges.

10. The apparatus of claim 9, further comprising means for positioning scattering bars within said mask in accordance with said set of rules.

11. The apparatus of claim 9, further comprising:
means for determining an interference map for each of said set of pitch ranges; and means for generating a set of rules for positioning scattering bars adjacent said plurality of features based on said interference map for each pitch range in said set of pitch ranges, each of said set of rules governing scattering bar placement for a specific pitch range.

12. The apparatus of claim 7, further comprising:
means for modifying the set of rules associated with a given pitch range based on the set of rules associated with an adjacent pitch range.

13. A computer program product for controlling a computer comprising a recording medium readable by the computer, means recorded on the recording medium for directing the computer to generate files corresponding to a mask having a plurality of features to be imaged in an lithographic imaging process, said generation of said files comprising the steps of
defining a set of process parameters to be utilized to image said mask;

defining a set of pitch ranges corresponding to pitches exhibited by said plurality of features to be imaged;

determining an interference map for at least one of said pitch ranges; and generating a set of rules for positioning scattering bars adjacent said plurality of features based on said interference map, said set of rules governing scattering bar placement adjacent features of said plurality of features having a pitch which falls within said at least one of said pitch ranges.

14. The computer program product of claim 13, wherein the generation of said files further comprises the step of positioning scattering bars within said mask in accordance with said set of rules.

15. The computer program product of claim 13, wherein the generation of said files further comprising the steps of:
determining an interference map for each of said set of pitch ranges; and generating a set of rules for positioning scattering bars adjacent said plurality of features based on said interference map for each pitch range in said set of pitch ranges, each of said set of rules governing scattering bar placement for a specific pitch range.

16. The computer program product of claim 15, wherein the generation of said files further comprising the step of modifying the set of rules associated with a given pitch range based on the set of rules associated with an adjacent pitch range.

17. A device manufacturing method comprising the steps of:
(a) providing a substrate that is at least partially covered by a layer of radiation-sensitive material;

(b) providing a projection beam of radiation using an imaging system;

(c) generating a mask having a plurality of feature, said mask utilized to endow the projection beam with a pattern in its cross-section;

(d) projecting the patterned beam of radiation onto a target portion of the layer of radiation sensitive material, wherein, in step (c), said mask is formed by a method comprising the steps of:

defining a set of process parameters to be utilized to image said mask;

defining a set of pitch ranges corresponding to pitches exhibited by said plurality of features to be imaged;

determining an interference map for at least one of said pitch ranges; and generating a set of rules for positioning scattering bars adjacent said plurality of features based on said interference map, said set of rules governing scattering bar placement adjacent features of said plurality of features having a pitch which falls within said at least one of said pitch ranges.

18. The device manufacturing method of claim 17, wherein the mask generating method of step (c) further comprises the step of positioning scattering bars within said mask in accordance with said set of rules.

19. The device manufacturing method of claim 17, wherein the mask generating method of step (c) further comprises the steps of:

determining an interference map for each of said set of pitch ranges; and generating a set of rules for positioning scattering bars adjacent said plurality of features based on said interference map for each pitch range in said set of pitch ranges, each of said set of rules governing scattering bar placement for a specific pitch range.

20. The device manufacturing method of claim 19, wherein the mask generating method of step (c) further comprises the step of modifying the set of rules associated with a given pitch range based on the set of rules associated with an adjacent pitch range.

* * * * *